(12) United States Patent
Won et al.

(10) Patent No.: US 8,624,280 B2
(45) Date of Patent: Jan. 7, 2014

(54) LIGHT EMITTING DEVICE PACKAGE AND METHOD FOR FABRICATING THE SAME

(75) Inventors: Yu Ho Won, Seoul (KR); Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 465 days.

(21) Appl. No.: 12/674,315

(22) PCT Filed: Aug. 7, 2008

(86) PCT No.: PCT/KR2008/004595
§ 371 (c)(1),
(2), (4) Date: Feb. 19, 2010

(87) PCT Pub. No.: WO2009/028807
PCT Pub. Date: Mar. 5, 2009

(65) Prior Publication Data
US 2011/0215353 A1 Sep. 8, 2011

(30) Foreign Application Priority Data
Aug. 27, 2007 (KR) .................. 10-2007-0086114

(51) Int. Cl.
*H01L 29/72* (2006.01)
(52) U.S. Cl.
USPC ........ 257/98; 257/E33.061; 285/37; 313/506; 313/512
(58) Field of Classification Search
USPC ........ 257/98, E33.061; 285/37; 313/506, 512
See application file for complete search history.

(56) References Cited

U.S. PATENT DOCUMENTS

| 7,193,365 | B2 | 3/2007 | Ishizaka |
| 7,282,748 | B2 | 10/2007 | Takeda et al. |
| 7,830,086 | B2 * | 11/2010 | Adachi et al. ................. 313/506 |
| 8,343,784 | B2 | 1/2013 | Park |
| 2002/0180351 | A1 * | 12/2002 | McNulty et al. ............. 313/512 |
| 2005/0141811 | A1 * | 6/2005 | Yang et al. .................... 385/37 |
| 2005/0156178 | A1 | 7/2005 | Takeda et al. |
| 2006/0054904 | A1 * | 3/2006 | Lin et al. ......................... 257/88 |
| 2006/0281203 | A1 * | 12/2006 | Epler et al. ..................... 438/22 |
| 2008/0128730 | A1 * | 6/2008 | Fellows et al. ................. 257/98 |
| 2010/0226015 | A1 * | 9/2010 | Taira et al. .................... 359/571 |
| 2011/0057205 | A1 * | 3/2011 | Mueller et al. ................. 257/84 |

FOREIGN PATENT DOCUMENTS

| JP | 11-204838 A | 7/1999 |
| JP | 2002-366289 A | 12/2002 |
| JP | 2003-046134 A | 2/2003 |
| JP | 2003-234509 A | 8/2003 |
| JP | 2004-111906 A | 4/2004 |
| JP | 2005-166941 A | 6/2005 |
| JP | 2005-209795 A | 8/2005 |
| JP | 2006-237264 * | 7/2006 |
| JP | 2006-237264 A | 9/2006 |
| JP | 2006-286701 A | 10/2006 |
| JP | 2007-027765 A | 2/2007 |
| JP | 2007-123905 A | 5/2007 |
| KR | 10-2005-0012372 A | 2/2005 |
| KR | 10-2006-0000464 B1 | 1/2006 |

* cited by examiner

*Primary Examiner* — Edward Wojciechowicz
(74) *Attorney, Agent, or Firm* — Birch, Stewart, Kolasch & Birch, LLP

(57) ABSTRACT

A light emitting device package comprises a substrate, an electrode on the substrate, a light emitting device on the substrate and electrically connected to the electrode layer, and a pattern enclosing the light emitting device.

7 Claims, 2 Drawing Sheets

LIGHT EMITTING DEVICE PACKAGE AND METHOD FOR FABRICATING THE SAME

TECHNICAL FIELD

The present disclosure relates to a light emitting device package and a method for fabricating the same.

BACKGROUND ART

A light emitting diode (LED) is a semiconductor light emitting device that converts a current into light.

A wavelength of the light emitted from the LED varies depending on a semi-conductor material used for fabricating the LED. That is, the wavelength of the light depends on a band-gap of the semiconductor material, which is an energy difference between electrons in the valence band and electrons in the conduction band.

As the luminance of the LED has gradually increased, the LEDs have been widely used as light sources of a variety of devices such as display devices, vehicles, and lightings. In addition, it is also possible to realize high efficiency LEDs that can emit white light by combining LEDs having different colors or by using phosphor materials.

In order to apply the LEDs to the above purposes, the LEDs have to have excellent light emitting efficiency and excellent luminance.

DISCLOSURE OF INVENTION

Technical Problem

Embodiments provide a light emitting device package of new structure and a method for fabricating the light emitting device package.

Embodiments also provide a light emitting device package that can effectively emit light generated by LEDs to an external side and a method for fabricating the light emitting device package.

Embodiments also provide a light emitting device having improved luminance and a method for fabricating the light emitting device.

Technical Solution

In an embodiment, a light emitting device package comprises a substrate; an electrode layer on the substrate; a light emitting device on the substrate and electrically connected to the electrode layer; and a filling enclosing the light emitting device and comprising a predetermined pattern.

In an embodiment, a light emitting device package comprises a substrate; an electrode on the substrate; a light emitting device on the substrate and electrically connected to the electrode layer; a filling enclosing the light emitting device; and a photoresist pattern on the filling.

In an embodiment, a light emitting device package comprises a substrate; an electrode on the substrate; a light emitting device on the substrate and electrically connected to the electrode layer; a filling enclosing the light emitting device; and a phosphor layer on the filling and comprising a predetermined pattern.

In an embodiment, a method for fabricating a light emitting device package comprises providing a substrate; forming an electrode layer on the substrate; installing a light emitting device on the substrate and electrically connecting the light emitting device to the electrode layer; enclosing the light emitting device with a filling; and forming a light extracting pattern on the filling.

Advantageous Effects

Embodiments can provide a light emitting device package having a new stricture and a method for fabricating the same.

Embodiments also can provide a light emitting device package that can effectively emit light generated by LEDs to an external side and a method for fabricating the light emitting device.

Embodiments also can provide a light emitting device having improved luminance and a method for fabricating the light emitting device.

MODE FOR THE INVENTION

Figure 1:
FIGS. 1 to 6 are views illustrating a light emitting device package and a method for fabricating the light emitting device package according to a first embodiment.

Reference will now be made in detail to the embodiments of the present disclosure, examples of which are illustrated in the accompanying drawings.

It will be apparent to those skilled in the art that various modifications and variations can be made in the present invention without departing form the spirit or scope of the invention. Thus, it is intended that the present invention covers the modifications and variations of this invention provided they come within the scope of the appended claims and their equivalents.

Like reference numerals designate like elements throughout the drawings. In the drawings, the thicknesses of layers, films, regions, etc., are exaggerated for clarity.

In the following description, it will be understood that when a layer (or film) is referred to as being 'on' another layer or substrate, it can be directly on the other layer or substrate, or intervening layers may also be present. Further, it will be understood that when a constituent element such as 'surface' is referred to as 'inner,' this means that the surface is farther from an outer side of the device than other constituent elements.

It will be further understood that orientations of constituent elements in the drawings are not limited thereto. In addition, when the word 'directly' is referred, it means that no intervening constituent element is present. The word 'and/or' means that one or more or a combination of relevant constituent elements is possible.

FIGS. 1 to 6 are views illustrating a light emitting device package and a method for fabricating the light emitting device package according to a first embodiment.

As shown in FIG. 1, mounting portions 11 on which light emitting devices are mounted and through holes 12 defining unit packages are formed on a substrate 10. The through holes 12 are formed at package dividing regions.

The substrate 10 may be formed of ceramic or silicon. The mounting portions 11 and the through holes 12 may be formed through a dry etching or wet etching process using a mask (not shown).

The mounting portions 11 are provided in the form of grooves to function as reflective cups for reflecting light emitted from the light emitting devices installed in the mounting portions 11 upward. Each of the mounting portions 11 is configured to have a depth and an inclined surface that can effectively extract the light emitted from the light emitting devices.

Figure 2:

As shown in FIG. 2, a pair of electrode layers 13 are formed around each of the mounting portions 11 on the substrate 10 to connect the mounting portion 11 to an outer side of the mounting portion 11. The electrode layers 13 may extend to a rear surface of the substrate 10 through the corresponding through holes 12.

When the electrode layers 13 extend from the mounting portion 11 to the rear surface of the substrate 10, the LED on the substrate 10 can be electrically connected to a printed circuit board upon installing the substrate 10 on the printed circuit board.

Needless to say, the electrode layers 13 may be formed only on a front surface of the substrate 10 or may be connected to an external side through the substrate 10 depending on design.

Meanwhile, when the substrate 10 is formed of a silicon wafer, a dielectric (not shown) may be formed between the substrate 10 and the electrodes 13. For example, the dielectric may be a silicon oxide layer.

The light emitting devices 20 are mounted on the respective mounting portions 11 on which the electrode layers 13 are formed. The light emitting devices 20 may be designed in a variety of types such as a lateral type, a vertical type, and a flip-chip type.

That is, the light emitting devices 20 may be electrically connected to the corresponding electrode layers 13 through wires or by directly contacting the corresponding electrode layers 13. Alternatively, the light emitting devices 20 may be electrically connected to the corresponding electrode layers 13 through a conductive material such as bump.

Figure 3:

As shown in FIG. 3, fillings 30 are filled in the mounting portions 11 on which the respective light emitting devices 20 are mounted. The fillings 30 may be formed of silicon gel or transparent epoxy. The fillings 30 may or may not contain phosphors.

When the fillings 30 contain the phosphors, the phosphors may be yellow phosphors for blue light or phosphors for ultraviolet rays, such as blue emitting phosphors, green emitting phosphors, and red emitting phosphors. The phosphors may be variously selected. For example, the phosphors may be formed of at least one of YAG, TAG, silicate, nitride, sulfide, selenide materials.

The fillings 30 may be filled in the mounting portion 11 through a dispensing process or a screen-printing process.

Top surfaces of the fillings 30 may be formed to be planar so as to make it easy to form a pattern functioning as a light extracting layer (that will be described later).

Figure 4:
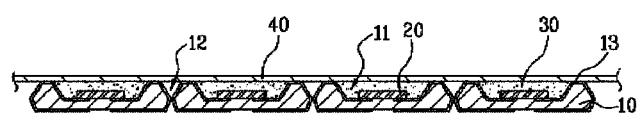
Figure 5:
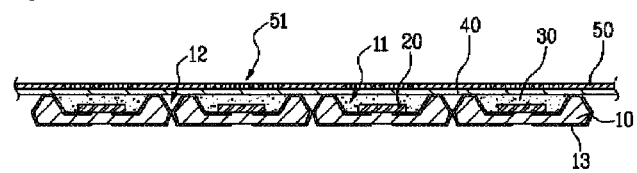

As shown in FIG. 4, a photoresist layer 40 is formed on the fillings 30. Subsequently, as shown in FIG. 5, a mask is disposed above the photoresist layer 40 and a photoresist pattern 41 (Referring to FIG. 6) is formed through an exposing/developing process.

Figure 6:
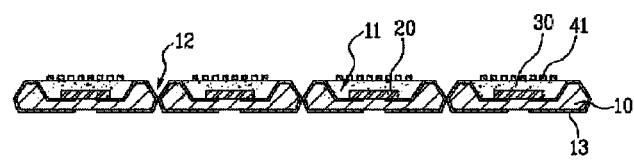

That is, as shown in FIG. 6, the photoresist pattern 41 is formed on the top surfaces of the fillings 30.

The photoresist pattern 41 forms a surface roughness structure, a grating structure, or a photonic crystal structure so that the light emitted from the light emitting devices 20 can be more effectively extracted to the external side through the fillings 30.

That is, the photoresist pattern 41 is formed on the top surface of the fillings 30 to function as the light extracting layer.

Figure 7:
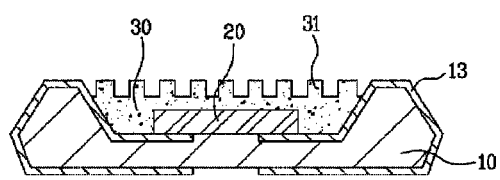
FIG. 7 is a view of a light emitting device package according to a second embodiment.

FIG. 7 is a view of a light emitting device package according to a second embodiment.

Referring to FIG. 7, the photoresist pattern 41 described in the first embodiment is used as a mask to selectively etch the fillings 30.

The fillings 30 may be etching through a wet etching process using HF, HNO, or the like or a dry etching process using $Cl_2$, $CF_4$, or the like.

When the fillings 30 are etched using the photoresist pattern 41, a filling pattern 31 having protrusions and grooves is formed on the top surfaces of the fillings 30. Here, the groove may have a depth of 100 nm-100 μm. The photoresist pattern 41 may be formed to have a cycle of 100 nm-100 μm.

After etching the filling 30, the photoresist pattern 41 is removed.

Like the photoresist pattern 41 described with reference to FIG. 6, the filling pattern 31 functions to effectively emit the light generated by the light emitting devices 20.

Figure 8:
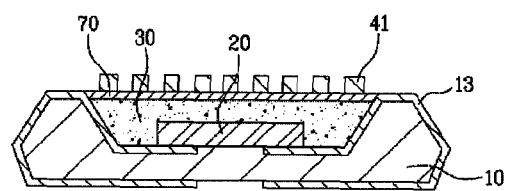
FIG. 8 is a view of a light emitting device package according to a third embodiment.

FIG. 8 is a view of a light emitting device package according to a third embodiment.

Before forming the photoresist layer 40 in FIG. 4, an adhesive layer 70 may be formed to enhance adhesive force between the photoresist layer 40 and the filling 30.

That is, referring to FIG. 8, the adhesive layer 70 is formed on the filling 30 and the photoresist layer 40 is formed on the adhesive layer 70. Subsequently, the photoresist layer 40 is selectively etched to form the photoresist pattern 41.

As shown in FIGS. 6 and 8, when the photoresist pattern 41 functions as the light extracting layer, the photoresist layer 40 may be formed of polymer having a photoresist property, such as SU-8.

The photoresist layer 40 may be formed of a material having a similar refractive index to the silicon gel or transparent epoxy. For example, the photoresist layer 40 may be formed of a material having a refractive index of 1.1-2.2.

Figure 9:
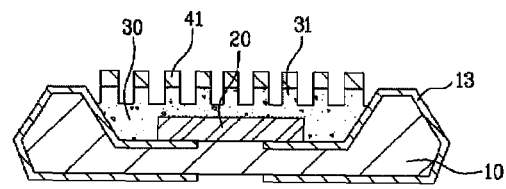
FIG. 9 is a view of a light emitting device package according to a fourth embodiment.

FIG. 9 is a view of a light emitting device package according to a fourth embodiment.

When the photoresist pattern 41 is not removed after etching the filling 30 using the photoresist pattern 41 as a mask in FIG. 6, a stricture shown in FIG. 9 is attained.

That is, as shown in FIG. 9, the filling pattern 31 is formed on the top surface of the filling 30 and the photoresist pattern 41 is formed on the top surface of the filling pattern 31.

As described above, the filling pattern 31 and the photoresist pattern 41 function as the light extracting layers.

The filling pattern 31 may be formed to have a cycle of 100 nm-100 μm and an etching depth of 100 nm-100 μm.

Figure 10:
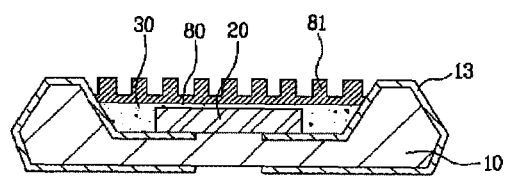
FIG. 10 is a view of a light emitting device package according to a fifth embodiment.

FIG. 10 is a view of a light emitting device package according to a fifth embodiment.

According to the fifth embodiment, the filling 30 does not contain the phosphors and a phosphor layer 80 is formed on the filling 30.

A phosphor layer pattern 81 is formed on a top surface of the phosphor layer 80. Like the photoresist pattern 41 and the filling pattern 31, the phosphor layer pattern 81 also functions as the light extracting layer for effectively extracting the light.

The phosphor layer 80 may be formed of silicon gel or transparent epoxy containing phosphors. The phosphor layer 80 may further contain binder.

The phosphor layer pattern 81 may be formed by selectively etching the top surface of the phosphor layer 80 using the photoresist pattern 41 as a mask.

In the fifth embodiment of FIG. 10, since the phosphor layer 80 is spaced apart from the light emitting device 20 by the filling 30, the property deterioration of the phosphor layer 80 due to heat generated by the light emitting device 20 can be prevented and the color uniformity of the light emitted from the light emitting device 20 can be enhanced.

Meanwhile, the filling pattern 31, the photoresist pattern 41, and the phosphor layer pattern 81, which are described in the embodiments, may be formed in a variety of shape such as a circular shape, a donut shape, a waffle shape, a honeycomb shape, and a rectangular shape when viewed from a top.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The light emitting device packages of the embodiments can be used as not only lightings but also light sources for a variety of electronic devices.

The invention claimed is:

1. A light emitting device package comprising:
a substrate;
an electrode layer on the substrate;
a light emitting device on the substrate and electrically connected to the electrode layer;
a molding part surrounding the light emitting device and comprising protrusions; and
a photoresist layer disposed only on the protrusions of the molding part,
wherein the molding part and the photoresist layer form the protrusions having high points and low points, the photoresist layer being only on the high points.

2. The light emitting device package according to claim 1, wherein the substrate comprises a recessed portion, and
wherein the light emitting device is disposed in the recessed portion.

3. The light emitting device package according to claim 2, wherein the electrode layer extends from the recessed portion to a bottom surface of the substrate.

4. The light emitting device package according to claim 1, wherein the photoresist layer has a refractive index of 1.1-2.2.

5. The light emitting device package according to claim 1, wherein the molding part contains phosphors.

6. The light emitting device package according to claim 1, wherein a cycle and/or depth of the protrusions of the molding part is 100 nm-100 μm.

7. The light emitting device package according to claim 1, wherein a width of the photoresist layer is approximately equal to a width of the molding part.

\* \* \* \* \*